United States Patent
Moenkemoeller

(10) Patent No.: US 9,787,065 B2
(45) Date of Patent: Oct. 10, 2017

(54) IONIZER FOR ADDING NEGATIVE IONS TO AIR, FOR EXAMPLE TO AIR INSIDE A MOTOR VEHICLE, AND METHOD OF OPERATING SAME

(71) Applicant: Ralf Moenkemoeller, Bielefeld (DE)

(72) Inventor: Ralf Moenkemoeller, Bielefeld (DE)

(73) Assignee: paragon AG, Delbrueck (DE)

( * ) Notice: Subject to any disclaimer, the term of this patent is extended or adjusted under 35 U.S.C. 154(b) by 393 days.

(21) Appl. No.: 14/592,925

(22) Filed: Jan. 9, 2015

(65) Prior Publication Data
US 2015/0214698 A1    Jul. 30, 2015

(30) Foreign Application Priority Data
Jan. 24, 2014 (DE) .......... 10 2014 000 931

(51) Int. Cl.
*H01T 23/00* (2006.01)
*G01R 19/00* (2006.01)
*G01R 31/28* (2006.01)
*H01T 19/04* (2006.01)

(52) U.S. Cl.
CPC ......... *H01T 23/00* (2013.01); *G01R 19/0092* (2013.01); *G01R 31/282* (2013.01); *H01T 19/04* (2013.01)

(58) Field of Classification Search
CPC ..... H01T 23/00; H01T 19/04; G01R 19/0092; G01R 31/282
See application file for complete search history.

(56) References Cited

U.S. PATENT DOCUMENTS

| | | | | |
|---|---|---|---|---|
| 4,809,127 A | * | 2/1989 | Steinman | H01T 23/00 361/213 |
| 6,127,780 A | * | 10/2000 | Winsor | H01J 61/307 313/493 |
| 2011/0192977 A1 | * | 8/2011 | Jendrejack | G03G 15/0208 250/326 |
| 2014/0291506 A1 | * | 10/2014 | Tikhonski | H05H 1/2406 250/282 |

FOREIGN PATENT DOCUMENTS

DE   102010056051 A   6/2012

* cited by examiner

*Primary Examiner* — Zeev V Kitov
(74) *Attorney, Agent, or Firm* — Andrew Wilford

(57) ABSTRACT

An ionizer for charging air in a motor vehicle with negative ions. The ionizer has an emitter with a pair of spaced electrodes, a high-voltage power supply, means connecting the power supply to the electrodes to apply a voltage differential across them and thereby ionize gas molecules adjacent the electrodes, and a sensor between the power supply and the electrodes for measuring current passing between the electrodes.

11 Claims, 2 Drawing Sheets

IONIZER FOR ADDING NEGATIVE IONS TO AIR, FOR EXAMPLE TO AIR INSIDE A MOTOR VEHICLE, AND METHOD OF OPERATING SAME

FIELD OF THE INVENTION

The present invention relates to an ionizer. More particularly this invention concerns an ionizer for a motor vehicle and a method of operating the ionizer.

BACKGROUND OF THE INVENTION

An ionizer is often used in the passenger compartment of a motor vehicle for adding negative ions to the air therein. Such an ionizer typically comprises an emitter that can strongly accelerate electrons in an inhomogeneous electrical field to such an extent that they emit and ionize gas molecules of the ambient air, and a high-voltage supply to which the emitter is connected and that can generate the high voltage required for accelerating the electrons in the inhomogeneous electrical field.

A corresponding ionizer comprising an emitter and an electronics box is known from DE 10 2010 056 051. In this known ionizer, the emitter is connected to the electronics box by a connection configured as a connecting line and is spatially separated therefrom. For this purpose, plug connectors are sometimes provided between the emitter that is separated from electronic box and the electronic box.

If these plug connectors between emitter and electronics box are not properly interlocked or have become detached over time, this remains unnoticed. Furthermore, it is not possible to detect whether and to what extent the emitter is damaged or functions properly. Such observations can only be detected with a complex ion measurement that would have to be carried out in the space to be charged with the negative ions.

Furthermore, when operating such ionizers for charging air with negative ions there are inpredictabilities in that ion generation depends on different environmental conditions that occur during operation of such an ionizer, for example on air temperature, humidity, but also on the particle concentration in the air to be charged with negative ions. Here, a multiplicity of mutual and complicated interdependencies occur that can be taken into account only with great difficulty during the operation of such ionizers. Thus, known ionizers of this kind operate with fixed or predetermined high voltages at the emitter. The value of the fixed high voltage is usually selected such that generation of negative ions is ensured under all conceivable environmental conditions of the emitter. Measurements have shown that when significantly exceeding the high voltage level that is required for generating negative ions, ozone is also generated as an undesirable by-product by such ionizers, and the generation rate of ozone increases significantly with increasing high voltage level at the emitter. A voltage level at the emitter significantly above the voltage level required for generating negative ions is therefore disadvantageous and, moreover, due to the accompanying amount of ozone generated at the same time, it presents a health risk.

OBJECTS OF THE INVENTION

It is therefore an object of the present invention to provide an improved ionizer for adding negative ions to air.

Another object is the provision of such an improved ionizer for adding negative ions to air that overcomes the above-given disadvantages, in particular to improve the generic ionizer for charging air, for example the interior air of motor vehicles, with negative ions in such a manner that it is possible to reliably detect, with as little technical effort as possible, whether the ionizer functions properly.

SUMMARY OF THE INVENTION

An ionizer for charging air in a motor vehicle with negative ions. The ionizer has according to the invention an emitter with a pair of spaced electrodes, a high-voltage power supply, means connecting the power supply to the electrodes to apply a voltage differential across them and thereby ionize gas molecules adjacent the electrodes, and a sensor between the power supply and the electrodes for measuring current passing between the electrodes.

This sensor can be at any position between the high-voltage supply and the emitter.

In an advantageous embodiment of the ionizer according to the invention, the high-voltage supply is provided in an electronics box to which the emitter is connected by the connecting means. Then, the sensor is advantageously integrated in the electronics box since this way the complexity of the connection between the sensor and the control electronics is reduced.

This sensor measures substantially only the electric current that is caused by those electrons that exit from one electrode of the emitter and enter into another electrode of the emitter. The sensor according to the invention therefore readily detects if plasma has formed between the electrodes of the emitter. The presence of plasma is a unique feature indicating that the emitter functions properly. For this, no additional connecting lines or the like are required. Thus, for the method according to the invention for operating the ionizer with a high-voltage supply and an emitter, the electric current between the high-voltage supply and the emitter is measured, and the voltage or the potential difference between the electrodes of the emitter is increased until a conductive plasma connection is formed between the electrodes.

In order to ensure proper function of the sensor, the electronics box including the components of the electronics box is advantageously configured such that, when there is no proper connection between the electronics box on the one hand and the emitter on the other, electrons do not leak at any point from the electronics box so that in this case, no electric current is measured by the sensor. This can be achieved, for example by sufficient insulation spacings and/or by avoiding sharp edges on conductors and contacts.

One essential aspect to be considered for the ionizer according to the invention and for the method according to the invention for operating it is that the current measurement according to the invention can detect that, or if at all, electrons exit at the emitter and thus ions are generated. For example, ion generation rates of such emitters of 12 million ions per $cm^3 \times 500$ $cm^3$ per second and therefore of about 6 billion ions per second were measured in laboratory tests. The electric current to be expected due to these exiting electrons therefore lies in the order of magnitude of 1 nA, a negative charge per ion being assumed here. Such a low electric current cannot be measured with reasonable economic and technical effort.

The emitter of the described ionizer consists of two electrodes. The first electrode that has the negative potential with respect to the second electrode is the reason for the generation of the negative ions. A second electrode is provided as counter electrode opposite to this first electrode, the second electrode having a more positive potential than the first electrode. Such a counter electrode is useful and advantageous for stable ion production at the emitter since a strong electrical field, which is required for a uniform and controlled ion generation, forms between the electrodes. When now the electric voltage between the two electrodes of the emitter is sufficiently high, a conductive plasma forms between the two electrodes. Electric currents greater than 1 µA can flow through this plasma connection. Electric currents in this order of magnitude can be measured with comparatively little technical effort and thus at low cost. Under otherwise constant environmental conditions, the amperage of this electrical current is a function of the applied voltage.

The sensor provided according to the invention substantially only detects the electric current that flows through the plasma connection between the two electrodes of the emitter. It was found during the laboratory test performed that as soon as a plasma connection is formed between the two electrodes of the emitter, electrons scatter into the surrounding area and initiate there the formation of negatively charged ions aimed by the operation of the ionizer.

According to an advantageous embodiment, the ionizer according to the invention has an adjuster by means of which the high voltage between two electrodes of the emitter can be regulated in such a manner that a conductive plasma connection forms between the electrodes of the emitter. The sensor can detect when the conductive plasma connection is being created between the two electrodes of the emitter. Thereafter, further increase of the voltage between the electrodes is no longer necessary or provided. Compared to the ionizers known from the prior art, this results in a considerably reduced ozone generation along with the associated positive effects on health.

When the voltage between the electrodes after formation of the conductive plasma connection between the two electrodes is further reduced to a level at which the conductive plasma connection formed between the first and second electrodes is just maintained, the basically undesirable ozone generation of the ionizer according to the invention can be further reduced.

According to an advantageous refinement of the ionizer according to the invention, the sensor as a whole is arranged or formed at or in the high-voltage supply or the electronics box and/or at the high-voltage-side or electronics-box-side end portion of the connection or the connector, respectively.

Advantageously, the ionizer according to the invention can include a diagnostic unit by means of which, corresponding to the measured value detected at the sensor, a faulty connection between the electronics box and the emitter can be diagnosed and indicated.

The diagnostic unit as well as the sensor is advantageously to be mounted on or in the electronics box or at the electronics-box-side connection parts because in this case, no additional components such as for example control resistors or jumpers or the like are required at the emitter.

The sensor can be associated with the line branch or conductor for supplying positive voltage to the emitter and/or with the line branch or conductor for supplying negative voltage to the emitter.

Advantageously, the sensor according to the invention makes it possible, for example by evaluating an I/U characteristic, to detect operating states that are not suitable for the operation of the ionizer such as, for example the presence of moisture or water at the emitter, it being possible for the adjuster of the ionizer according to the invention to counteract such unsuitable operating states.

Moreover, it is advantageous if flashovers between the electrodes of the emitter can be detected by the sensor, and if in response the voltage difference between the electrodes of the emitter can be reduced by the adjuster of the ionizer.

BRIEF DESCRIPTION OF THE DRAWING

The above and other objects, features, and advantages will become more readily apparent from the following description, reference being made to the accompanying drawing in which.

SPECIFIC DESCRIPTION OF THE INVENTION

Figure 1:
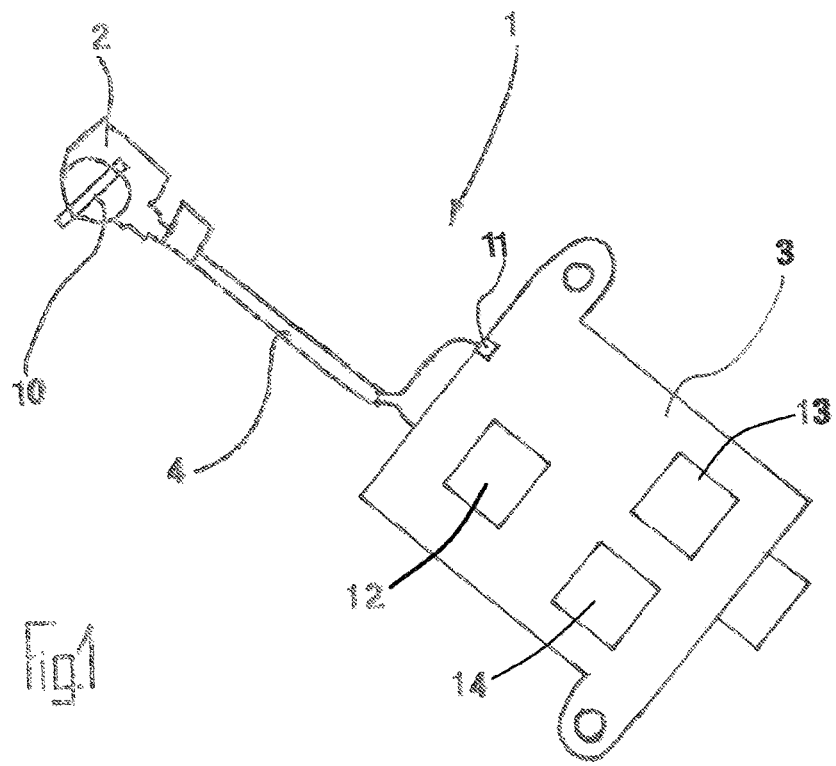
FIG. 1 shows a first embodiment of an ionizer according to the invention for charging air with negative ions.

As seen in FIG. 1, an ionizer 1 according to the invention serves for charging air provided or present in an interior with negative ions. Such an ionizer 1 can be used in particular inside a motor vehicle since the proportion of so-called technical surfaces that reduce the natural content of negative ions in the air is very high in such a confined space.

An ionization module or an emitter 2 that, in the illustrated embodiment, is configured as an emitter has a point electrode in the embodiment of the ionizer 1 shown in FIG. 1.

In the case of the emitter 2 of the ionizer 1 according to the invention, the principle of corona discharge or point discharge is utilized. Here, electrons are strongly accelerated in a very inhomogeneous electric field to such an extent that they ionize gas molecules present in the ambient air. Direct voltage is used for generating the electric field at the emitter 2.

A first electrode or a point electrode belongs to the emitter 2, and a second electrode or a counter electrode is arranged around the point electrode. This counter electrode is connected to an electric potential that is significantly more positive than the electric potential at the point electrode.

In order to provide the electric energy required for generating the electric field at the emitter 2, the ionizer 1 comprises a high-voltage power supply 14 that can be housed in a box 3 with a cover, for example.

The electronics box 3 of the ionizer 1 in the illustrated embodiment is arranged spatially separated and spaced apart from the emitter 2 of the ionizer 1.

In the case of the embodiment of the ionizer 1 shown in FIG. 1, a connector in the form of a line configured as a high voltage cable 4 is provided for connecting the emitter 2 to the electronics box 3. Due to the connection of the emitter 2 to the electronics box 3 of the ionizer 1 by the high voltage cable 4 it is possible that the emitter 2 can be positioned in a small installation spaces in close proximity to air outlets close to interior of a motor vehicle. The electronics box 3 can be attached or fastened at a suitable and uncritical location that is less exposed.

Figure 2:
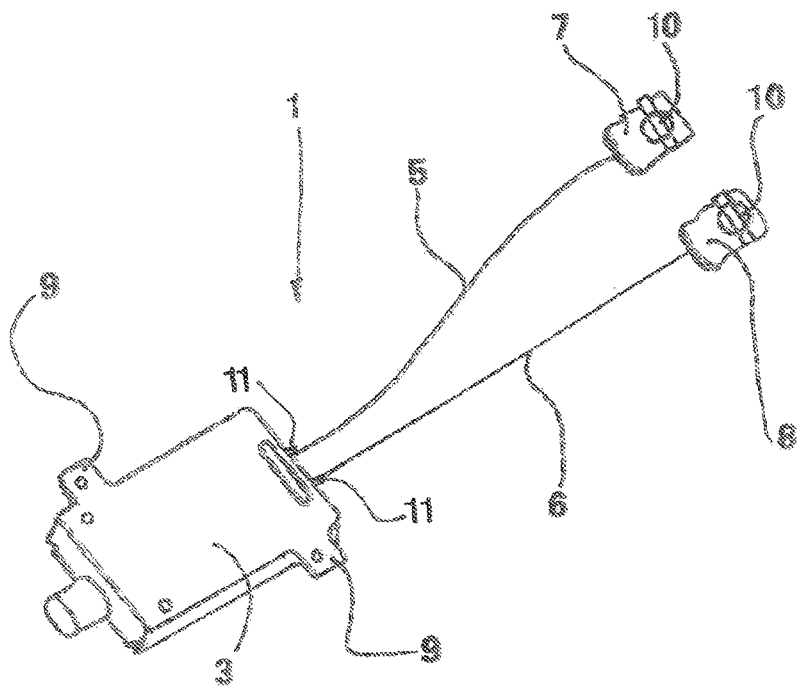
FIG. 2 shows a second embodiment of the ionizer according to the invention.

An embodiment of the ionizer 1 according to the invention shown in FIG. 2 differs from the embodiment shown above in FIG. 1 in that the electronics box 3 is connected to two emitters 7 and 8 of the ionizer 1 via respective high-voltage cables 5 and 6. In this manner it is possible, for example in motor vehicle applications, that two separate air outlets supplying ambient air to the motor vehicle interior can each be equipped with a respective emitter 7 or 8. It is therefore possible, for example, that the driver and the passenger in a motor vehicle are supplied separately with air enriched with negative ions.

In the embodiments shown in the FIGS. 1 and 2, the electronics box 3 of the ionizer 1 can be attached at its mounting location at any place in the motor vehicle by fastening lugs 9. The spacing between the mounting location of the electronics box 3 and the emitter 2 and the two emitters 7 and 8 can be relatively large.

The emitter 2 or the emitters 7 and 8 of the ionizer 1 according to the invention can be fastened in a simple manner at the respective mounting location or place of use. A bayonet coupling 10 is provided here with a seal ring that provides its sealing function as soon as the emitter 2 or the emitters 7 and 8 are fixed at their place of use by the bayonet joint 10.

The electronic box 3 including its connection or connections to the emitter 2 or to the emitters 7 and 8 is configured in such a manner that electrons cannot exit from any part of the electronics box 3 in the event that the emitter 2 or the emitters 7 and 8 are not connected. This can be achieved, for example, by sufficient insulation spacings and/or by avoiding sharp edges on conductors and contacts.

The emitter 2 or the emitters 7 and 8 are in each case composed of two electrodes, namely the first electrode formed as a point electrode and the second electrode formed as a counter electrode. As already explained, the point electrode is the reason for the generation of negative ions and carries a negative voltage that is high with respect to the counter electrode. The counter electrode is spacedly juxtaposed with this point electrode and has a positive potential with respect to that of the point electrode. Such emitter configurations have proven to be advantageous for stable ion production.

When the voltage between the point electrode and the counter electrode is high enough, conductive plasma forms between the two electrodes, and this plasma establishes a plasma connection between the two electrodes. Electric currents that are greater than 1 µA can flow through this plasma connection. Electric currents of this order of magnitude can be measured with comparatively little technical effort.

Under constant environmental conditions, the magnitude of the electric current flowing between the two electrodes of the emitter 2 or the emitters 7 and 8 is a function of the voltage applied to the two electrodes. The electric current between the electrodes is formed from electrons that exit at the negatively charged point electrode and enter into the second electrode or counter electrode that is positively charged with respect to the negatively charged point electrode. As soon as plasma has formed between the two electrodes, a number of electrons exits into the surrounding area or scatters into the surrounding area and there forms of the desired negatively charged ions.

The ionizer 1 comprises a sensor 11 that can measure the electric current in the connecting line 4 to the emitter 2 and in the connecting lines 5 and 6 to the emitters 7 and 8 can be measured. In the embodiments shown, the sensor 11 is provided at the electronics box. It is possible for the sensor 11 to measure electric current in the order of magnitude of 1 µA.

By measuring the current in the connecting lines 4 and 5 and 6 running to the emitter 2 or the emitters 7 and 8 with means of the sensor 11, one can reliably detect when a plasma connection has formed between the two electrodes of the emitters 2, 7 and 8. Depending on the environmental conditions, this plasma connection forms even at varying voltage differences between the electrodes of the emitters 2, 7 and 8.

Since electric current in the connecting line 4, 5 or 6 and/or the formation of a plasma connection between the point electrode and the counter electrode of the emitters 2, 7 and 8 can be detected by the sensor 11, it is possible to adjust the high voltage at the emitters 2, 7 and 8 by an adjuster 12, in such a manner that the above-described plasma connection between the electrodes of the emitter 2, 7 and 8 is just formed. Thus, the high voltage can be set as low as possible. Accordingly, the ionizer 1 can operate in such a manner—namely under any environmental conditions—that the high voltage at the emitter 2, 7 and 8 is set in the range of the absolutely required minimum. This also ensures that with regard to the harmful ozone generation that is to be prevented, the ionizer 1 operates at a rate at the possible minimum.

During operation of the ionizer 1, the maximum adjustable high voltage is limited to a maximum value. If the sensor 11 measures no electric current in the connecting lines 4, 5 and 6 running to the emitter 2, 7 and 8 until this maximum value is reached, an irregularity has occurred. This irregularity can be caused by a faulty connection or a damaged emitter. In such a case, an error message can be transmitted to a controller by the ionizer 1.

The sensor 11 can of course also be used for such emitters that are provided directly at the electronics box 3 or integrally with this electronics box 3.

The diagnostics to determine whether the connection between the electronics box 3 on the one hand and the emitter 2 on the other functions properly are carried out by a diagnostics unit 13 as follows:

The voltage between the first and the second electrodes of the emitter 2 is increased up to a specified maximum value. This maximum value is specified empirically in such a manner that a plasma connection between the two electrodes of the emitters 2 is established under any of the operating conditions defined for the ionizer 1. As soon as this plasma connection is created between the two electrodes of the emitter 2, the electric current in the connecting line 4 between the electronics box 3 on the one hand and the emitter 2 on the other increases significantly. The electric current in the connecting line 4 increases from a few nA to several µA, for example.

If this significant increase of the electric current before or up to reaching the maximum value of the voltage between the electrodes of the emitter 2 does not occur, then there is an error condition. The error can be a faulty connection to an electrode of the emitter 2, for example. The error can also be caused by a damaged, for example bent or contaminated, electrode of the emitter 2.

For adjusting the operating voltage of the ionizer 1, the procedure is as follows:

The voltage between the two electrodes of the emitter 2 is increased up to the specified maximum value. This maximum value is specified empirically in such a manner that a plasma connection between the two electrodes of the emitters 2 is established under any of the operating conditions defined for the ionizer 1. Upon formation of the plasma connection between the two electrodes of the emitter 2, a significant increase of the electric current occurs in the connecting line 4 between the electronics box 3 and the emitter 2. The electric current in the connecting line 4 increases from a few nA to several µA.

Since the voltage for forming the plasma connection between the two electrodes of the emitter 2 is significantly higher than the voltage level required for maintaining the plasma connection between the two electrodes of the emitter 2, a comparatively high current will flow after igniting the plasma or establishing the plasma connection between the two electrodes of the emitter 2. The level of the electric current can lie above 20 µA, for example. The reason for this is that the resistance of the plasma connection is inversely proportional to the voltage applied, i.e. the resistance of the plasma connection decreases with increasing voltage.

During operation of the ionizer 1, the voltage between the two electrodes of the emitter 2 is reduced again after the formation of the plasma connection between the electrodes of the emitter 2 until the electric current between the two electrodes of the emitter 2 is set to a specified value that is comparatively low. This level of the electric current can be, for example 1.0 µA.

This setting of the voltage between the electrodes of the emitter 2 and the resulting reduction of the electric current between the electrodes ensures that the high voltage between the electrodes of the emitter 2 is only insignificantly higher than the minimum high voltage required for maintaining the plasma connection between the two electrodes of the emitter 2. Insignificantly higher in this context means higher by not more than 100 VDC. Due to this limitation of the high voltage between the two electrodes of the emitter 2, an extremely low ozone generation rate as by-product is ensured during the operation of the ionizer 1.

Figure 3:
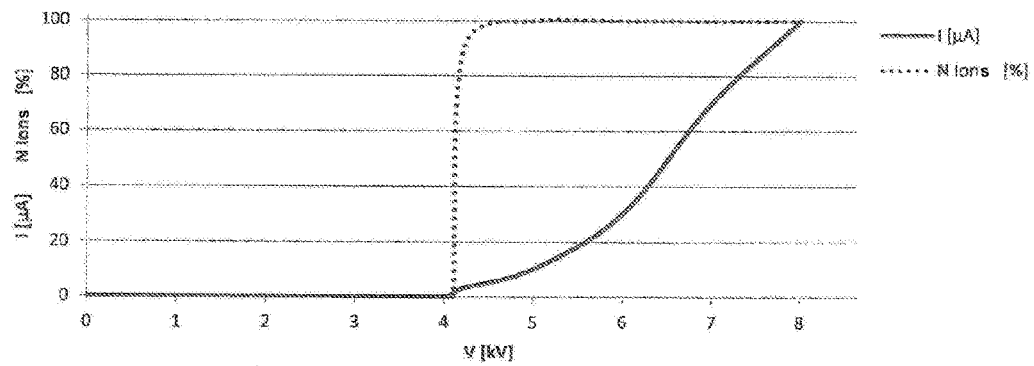
FIG. 3 is a graph of a typical emitter current characteristic.

FIG. 3 shows a typical emitter current characteristic for the operation of the emitter 2 or the emitters 7 and 8, respectively. It is apparent from this characteristic that the plasma connection between the two electrodes of the emitter 2 forms at a high voltage level that is slightly higher than 4 kV. A further increase of the high voltage does not result in a noticeable increase of the number of ions.

As soon as am electric current is sensed by the sensor 11 that therefore detects that there is a plasma connection between the two electrodes of the emitter 2, the high voltage can be leveled off by the adjuster 12, which is not shown in the figures, to that level that is just sufficient for maintaining the plasma connection between the two electrodes of the emitter 2.

Figure 4:
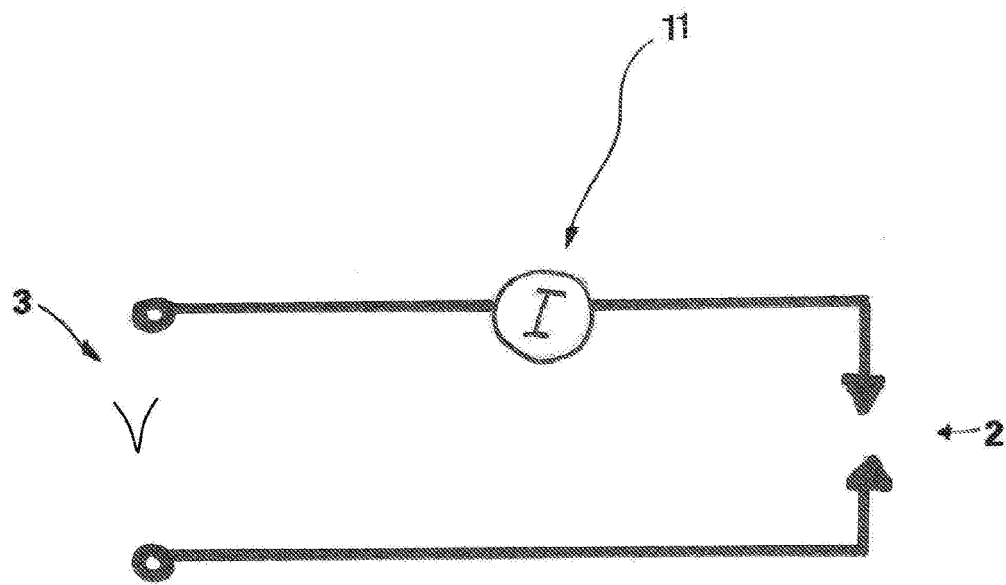
FIG. 4 shows a schematic diagram of a sensor of the ionizer according to the invention.

FIG. 4 principally illustrates how the sensor 11 is arranged between the electronics box 3 and the emitter 2.

I claim:

1. An ionizer for charging air in a motor vehicle with negative ions, the ionizer comprising:
   an emitter having a pair of spaced electrodes;
   a high-voltage power supply;
   means connecting the power supply to the electrodes to apply a voltage differential across them and thereby ionize gas molecules adjacent the electrodes; and
   a sensor between the power supply and the electrodes for measuring current passing between the electrodes;
   means connected to the sensor for adjusting an output voltage of the source in accordance with a level of the current sensed by the sensor such that a conductive plasma forms between the electrodes of the emitter; and
   means connected to the power supply and to the sensor for diagnosing a faulty connecting means by monitoring an output of the sensor.

2. The ionizer defined in claim 1, further comprising:
   a box holding the high-voltage source, the connecting means extending between the emitter and the box.

3. The ionizer defined in claim 2, wherein the box and connecting means are constructed such that in the absence of the emitter electricity cannot leak from the ionizer.

4. The ionizer defined in claim 1, further comprising the step, after a conductive plasma forms between the electrodes of the emitter, of:
   reducing by the adjusting means the output voltage of the source such that the conductive plasma between the electrodes is just maintained.

5. The ionizer defined in claim 1, wherein the sensor is at or in the high-voltage supply or at a high-voltage-side of the connecting means.

6. The ionizer defined in claim 1, wherein the connecting means includes a line for supplying positive voltage to the emitter and a line for supplying negative voltage to the emitter, the sensor being in one of the lines.

7. The ionizer defined in claim 1, wherein the means for diagnosing monitors a current/voltage characteristic of current in the connecting means.

8. The ionizer defined in claim 1, wherein the means for diagnosing, on detecting a flashover between the electrodes, reduces the voltage of the supply.

9. A method of operating an ionizer having an emitter comprising a pair of spaced electrodes, a high-voltage power supply, and means connecting the power supply to the electrodes, the method comprising the steps of:
   applying a more negative potential from the supply to one of the electrodes than to the other electrode;
   monitoring current flowing by a sensor between the supply and the electrodes;
   increasing voltage at one of the electrodes until a conductive plasma forms between the electrodes, with the one electrode being more negative than the other electrode; and
   diagnosing a faulty connecting means by monitoring an output of the sensor.

10. The method defined in claim 9, further comprising the step of:
    after forming the conductive plasma between the electrodes, reducing the current flowing between the electrodes and the supply to a level at which the conductive plasma connection is just maintained.

11. The ionizer defined in claim 1, wherein the connecting means are conductor lines between the power supply and the electrodes.

* * * * *